United States Patent
Park et al.

(10) Patent No.: US 8,189,425 B2
(45) Date of Patent: May 29, 2012

(54) SEMICONDUCTOR MEMORY DEVICE (75) Inventors: Heat-Bit Park, Gyeonggi-do (KR); Jae-Il Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 244 days.

(21) Appl. No.: 12/751,435

(22) Filed: Mar. 31, 2010

(65) Prior Publication Data
US 2011/0158033 A1 Jun. 30, 2011

(30) Foreign Application Priority Data
Dec. 30, 2009 (KR) .................. 10-2009-0134832

(51) Int. Cl.
*G11C 8/00* (2006.01)

(52) U.S. Cl. ............................. 365/233.18; 365/233.1

(58) Field of Classification Search ............. 365/233.18, 365/233.1
See application file for complete search history.

(56) References Cited

U.S. PATENT DOCUMENTS
6,847,570 B2 * 1/2005 Fujioka et al. ............... 365/222

FOREIGN PATENT DOCUMENTS
| KR | 10-1998-0046101 | 9/1998 |
| KR | 10-0600331 | 7/2006 |
| KR | 10-2008-0076087 | 8/2008 |
| KR | 1020090042584 | 4/2009 |

OTHER PUBLICATIONS

Notice of Allowance issued from Korean Intellectual Property Office on Nov. 30, 2011.
Notice of Preliminary Rejection issued from Korean Intellectual Property Office on Apr. 18, 2011.

* cited by examiner

*Primary Examiner* — Son Dinh
*Assistant Examiner* — Nam Nguyen
(74) *Attorney, Agent, or Firm* — IP & T Group LLP (57) ABSTRACT

A semiconductor memory device includes a burst pulse generation unit configured to store a burst length information signal in response to a first control signal and output the burst length information signal as a burst pulse signal in response to a second control signal; and an input/output(I/O) control unit configured to generate the first and second control signals in response to a read pulse signal and a latency signal, respectively.

18 Claims, 6 Drawing Sheets

SEMICONDUCTOR MEMORY DEVICE

CROSS-REFERENCE TO RELATED APPLICATION

The present application claims priority of Korean Patent Application No 10-2009-0134832, filed on Dec. 30, 2009, which is incorporated herein by reference in its entirety.

BACKGROUND OF THE INVENTION

Exemplary embodiments of the present invention relate to a semiconductor device, and more particularly, to a semiconductor memory device for reliably performing operations according to a burst length.

Semiconductor memory devices including a double data rate synchronous dynamic random access memory (DDR SDRAM) contain a plurality of memory cells and perform read/write operations according to instructions from a chipset. The semiconductor memory devices stores a data signal in a memory cell corresponding to an address input from the chipset in response a write operation instruction and outputs a data signal stored in a memory cell corresponding to an address input from the chipset in response a read operation instruction.

In order to improve the efficiency of the read and write operations of the semiconductor memory device, it is possible to set the number of data signals consecutively inputted or outputted through a single input/output (I/O) pad. In this disclosure, the number of the data signals consecutively inputted or outputted through the single I/O pad is referred to as "the burst length." For example, four data signals are consecutively inputted or outputted through the single I/O pad when the burst length is set to 4 and eight data signals are consecutively inputted or outputted through the single I/O pad when the burst length is set to 8. Generally, the burst length is defined by a signal externally inputted and the semiconductor memory device consecutively inputs or outputs a number of data signals corresponding to the burst length in response to the signal.

Figure 1:
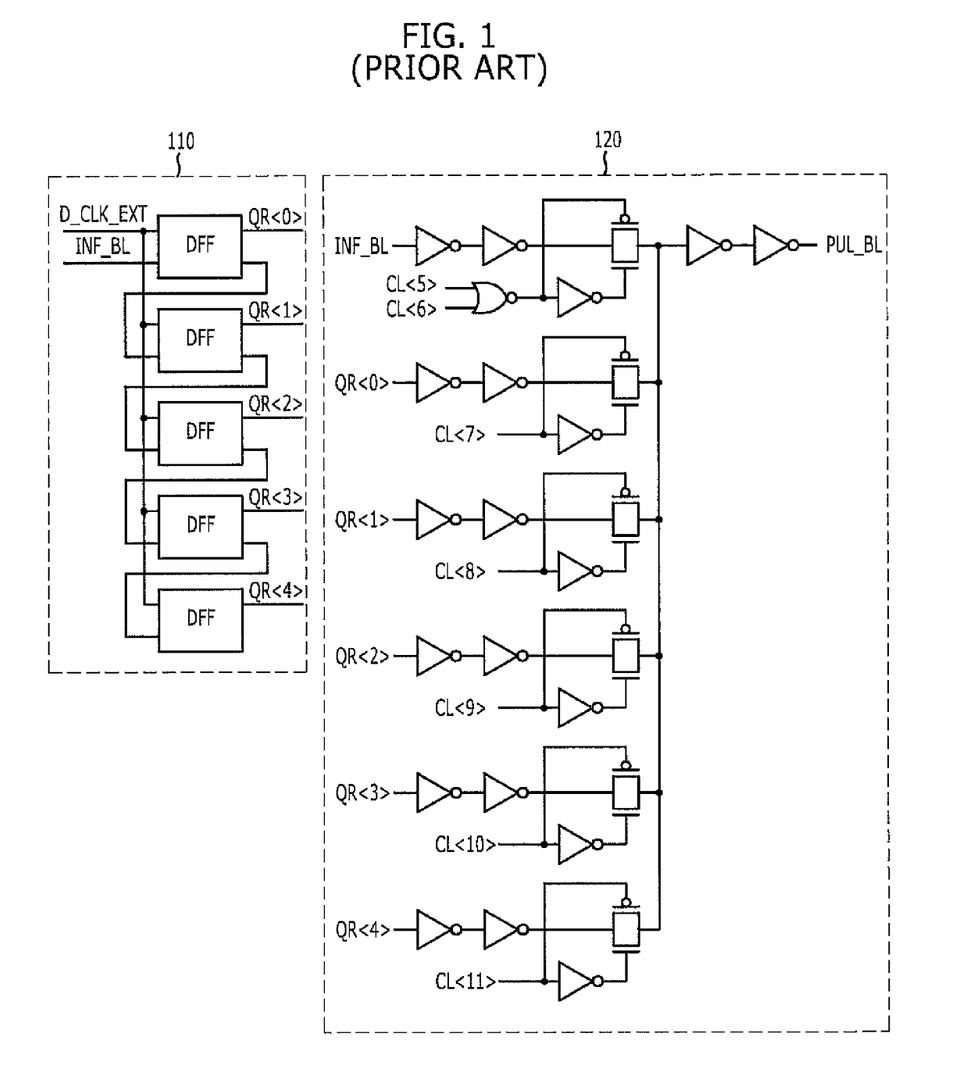
FIG. 1 is a block diagram depicting a conventional semiconductor memory device.

FIG. 1 is a block diagram depicting a conventional semiconductor memory device.

The semiconductor memory device includes a shift unit 110 and a multiplex (MUX) unit 120. The shift unit 110 includes a plurality of D-flip flips (DFF) and shifts a burst length information signal INF_BL in response to an external clock signal D_CLK_EXT. The MUX unit 120 selects one of the burst length information signal INF_BL and outputs QR<0:4> of the shift unit 110 in response to column access strobe (CAS) latency signals CL<5:11> and outputs the selected one as a burst length pulse signal PUL_BL.

Herein, the burst length information signal INF_BL defines the burst length of the semiconductor memory device. For example, the burst length of the semiconductor memory device is set to 4 when the burst length information signal INF_BL has a logic low level and the burst length of the semiconductor memory device is set to 8 when the burst length information signal INF_BL has a logic high level.

Figure 2:
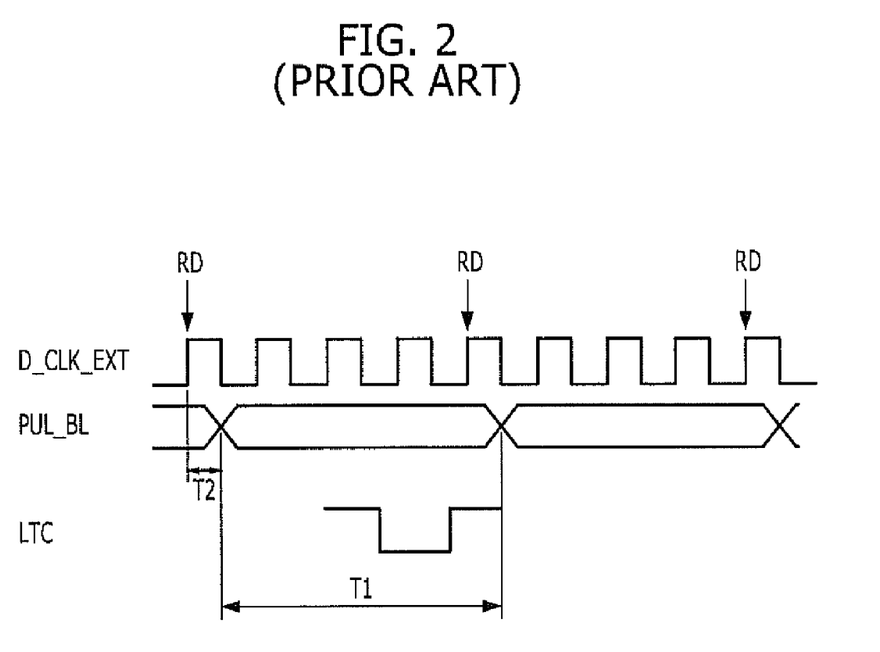
FIG. 2 is a timing waveform illustrating an operation of the semiconductor memory device shown in FIG. 1.

FIG. 2 is a timing waveform illustrating an operation of the semiconductor memory device shown in FIG. 1.

The semiconductor memory device determines the burst length by combining the burst length pulse signal PUL_BL and a latency signal LTC. In detail, the semiconductor memory device determines the burst length based on a logic level of the burst length pulse signal PUL_BL at an active period of the latency signal LTC. For example, the semiconductor memory device operates according to the burst length of 4 when the burst length pulse signal PUL_BL has a logic low level at the active period of the latency signal LTC and the semiconductor memory device operates according to the burst length of 8 when the burst length pulse signal PUL_BL has a logic high level at the active period of the latency signal LTC. For ensuring a correct operation of the semiconductor memory device, the active period of the latency signal LTC should be placed within a valid window T1 of the burst length pulse signal PUL_BL.

The latency signal LTC controls a data output timing of the semiconductor memory device and the active period of the latency signal LTC is determined based on the CAS latency signal CL<5:11> in synchronism with an internal clock signal. The internal clock signal is outputted from a delay locked loop (DLL) circuit.

As an operational frequency of the semiconductor memory device becomes higher, it becomes difficult to place the active period of the latency signal LTC within the valid window T1 of the burst length pulse signal PUL_BL. This problem is mainly caused because the burst length pulse signal PUL_BL is generated in synchronism with the external clock signal D_CLK_EXT and the latency signal LTC is generated in synchronism with the internal clock signal.

Accordingly, the semiconductor memory device shown in FIG. 2 performs erroneous operations based on incorrect burst length information as the operational frequency increases. This causes the deterioration of reliability of the semiconductor memory device.

SUMMARY OF THE INVENTION

An embodiment of the present invention is directed to a semiconductor memory device expanding a valid window of the burst length information signal by using a code controlled latching method.

In accordance with an embodiment of the present invention, a semiconductor memory device includes a burst pulse generation unit configured to store a burst length information signal in response to a first control signal and output the burst length information signal as a burst pulse signal in response to a second control signal; and an input/output(I/O) control unit configured to generate the first and second control signals in response to a read pulse signal and a latency signal, respectively.

In accordance with another embodiment of the present invention, an operation method of a semiconductor memory device, includes storing a first burst length information signal corresponding to a first read pulse signal in response to the first read pulse signal; outputting the first burst length information signal as a burst pulse signal in response to a latency signal corresponding to the first read pulse signal; storing a second burst length information signal corresponding to a second read command signal in response to the second read pulse signal; and outputting the second burst length information signal as the burst pulse signal in response to the latency signal corresponding to the second read pulse signal.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
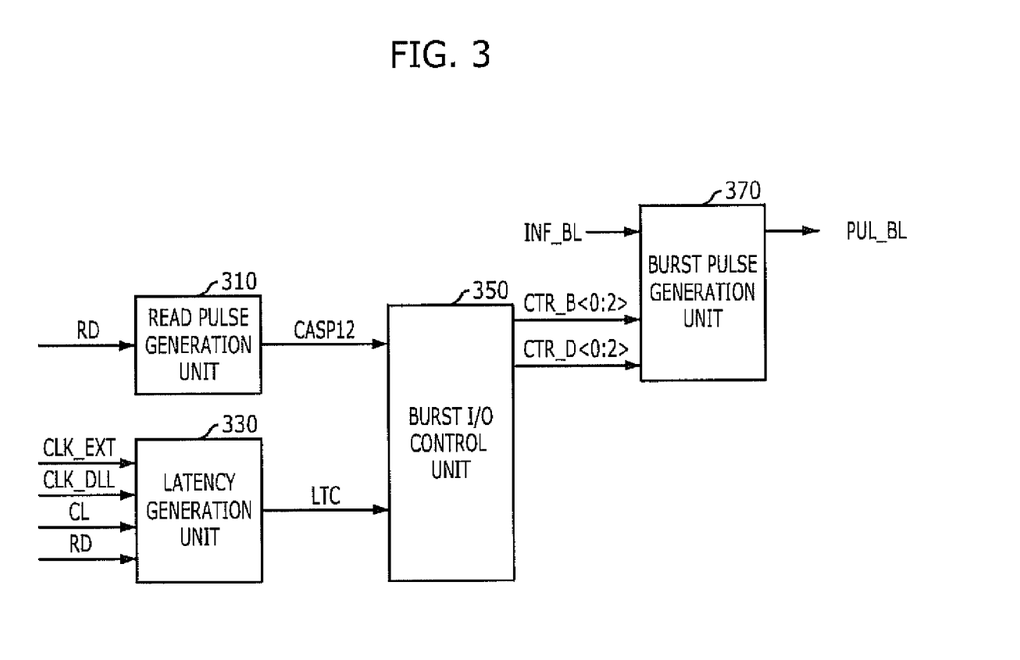
FIG. 3 is a block diagram of a semiconductor memory device in accordance with an embodiment of the present invention.

FIG. 3 is a block diagram of a semiconductor memory device in accordance with an embodiment of the present invention.

The semiconductor memory device includes a read pulse generation unit 310, a latency generation unit 330, a burst input/output (I/O) control unit 350 and a burst pulse generation unit 370.

The read pulse generation unit 310 generates a read pulse signal CASP12 having a predetermined pulse width in response to a read command signal RD. The latency generation unit 330 counts an external clock signal CLK_EXT and an internal clock signal CLK_DLL and generates a latency signal LTC corresponding to a CAS latency CL in response to the read command RD. The burst I/O control unit 350 generates a first control signal CTR_B<0:2> and a second control signal CTR_D<0:2> in response to the read pulse signal CASP12 and the latency signal LTC. Herein, the first control signal CTR_B<0:2> includes a plurality of bits, each of which is sequentially activated in response to the read pulse signal CASP12. The second control signal CTR_D<0:2> includes a plurality of bits, each of which is sequentially activated in response to the latency signal LTC. In this embodiment of the present invention, both the first and second control signals CTR_B<0:2> and CTR_D<0:2> are implemented with three bits signals. The burst pulse generation unit 370 stores a burst length information signal INF_BL in response to the first and second control signals CTR_B<0:2> and CTR_D<0:2> and generates a burst length is pulse signal PUL_BL. A logic level of the burst length pulse signal PUL_BL is determined based on that of the burst length information signal INF_BL. The semiconductor memory device performs operations according to a burst length determined based on the logic level of the burst length pulse signal PUL_BL. For example, the semiconductor memory device operates according to the burst length of 4 when the burst length pulse signal PUL_BL has a logic low level and the semiconductor memory device operates according to the burst length of 8 when the burst length pulse signal PUL_BL has a logic high level.

Figure 4:
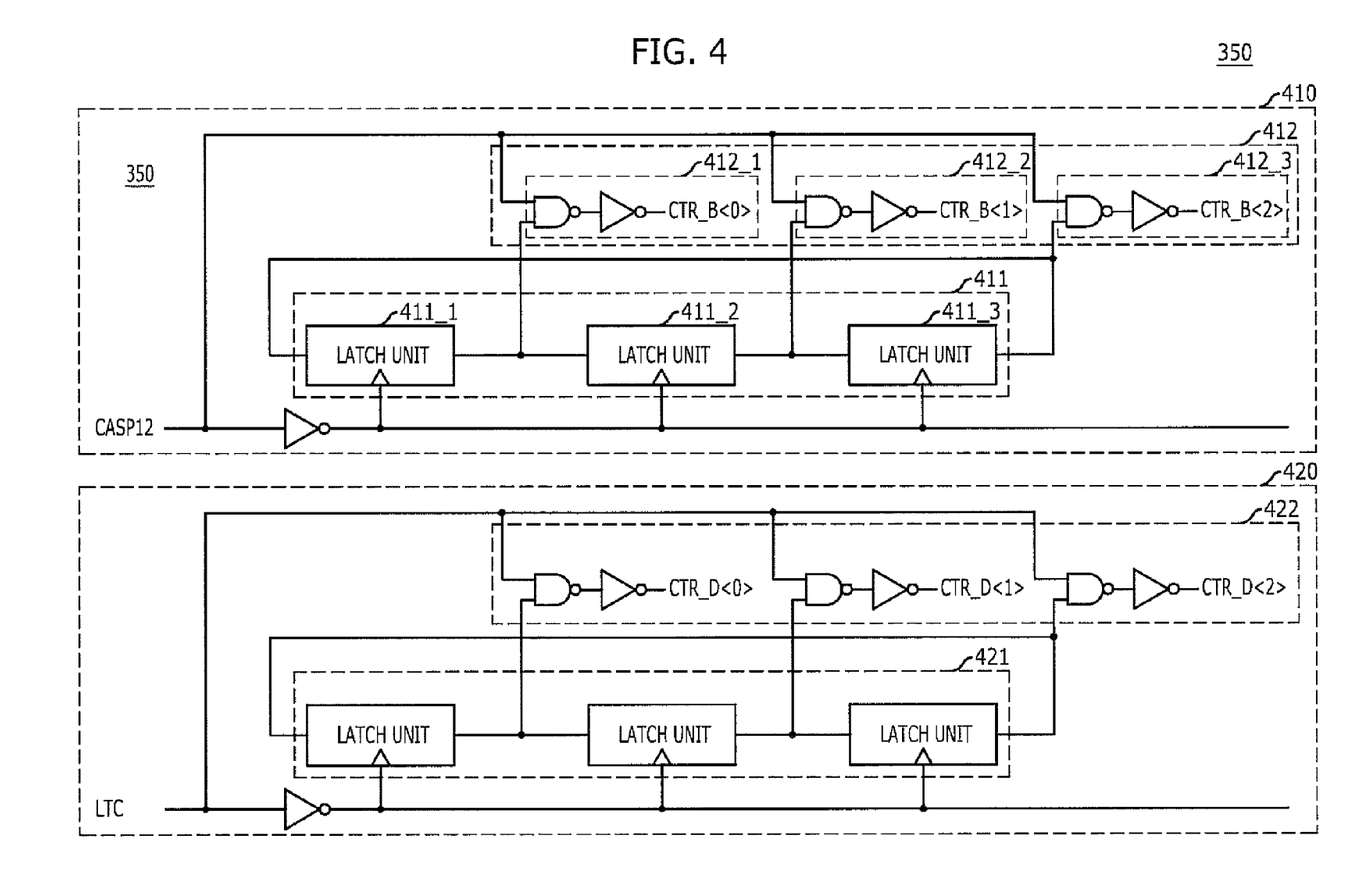
FIG. 4 is a schematic circuit diagram of a burst I/O control unit shown in FIG. 3.

FIG. 4 is a schematic circuit diagram of the burst I/O control unit shown in FIG. 3.

The burst I/O control unit 350 includes a first control signal generation unit 410 and a second control signal generation unit 420. The first control signal generation unit 410 counts the read pulse signal CASP12 corresponding to the read command signal RD and generates the first control signal CTR_B<0:2>. The second control signal generation unit 420 counts the latency signal LTC and generates the second control signal CTR_D<0:2>.

The first control signal generation unit 410 includes a first shift unit 411 and a first control signal output unit 412. The first shift unit 411 performs a shift operation in response to the read pulse signal CASP12 and includes three latch units 411_1 to 411_3. The first control signal output unit 412 generates the first control signal CTR_B<0:2> by using outputs of the latch units 411_1 to 411_3 and includes three output units 412_1 to 412_3. In detail, the first output unit 412_1 generates the first control signal CTR_B<0> in response to the read pulse signal CASP12 and the output of the first latch unit 411_1. The second output unit 412_2 generates the first control signal CTR_B<1> in response to the read pulse signal CASP12 and the output of the second latch unit 411_2. The third output unit 412_3 generates the first control signal CTR_B<2> in response to the read pulse signal CASP12 and the output of the third latch unit 411_3.

The second control signal generation unit 420 includes a second shift unit 421 and a second control signal output unit 422. The detailed structures and the operations of the second shift unit 421 and the second control signal output unit 422 are with the same as those of first shift unit 411 and the first control signal output unit 412 except that the second shift unit 421 and a second control signal output unit 422 operates in response to the latency signal LTC instead of the read pulse signal CASP12. In detail, the second shift unit 421 performs a shift operation in response to the latency signal LTC and includes three latch units. The second control signal output unit 422 generates the second control signal CTR_D<0:2> by using outputs of the latch unit and includes three output units.

Hereinafter, the operation of the burst I/O control unit 350 is explained. As mentioned above, the operations of the first and second control signal generation units 410 and 420 are the same except that they operate in response to different input signals (that is, LTC and CASP12). Therefore, only the operation of the first control signal generation unit 410 will be presented below and the operation of the second control signal generation unit 420 may be easily induced therefrom.

When the read pulse signal CASP12 is activated, the latch units 411_1 to 411_3 start the shift operation in response to the read pulse signal CASP12. In detail, the output of the first latch unit 411_1 is outputted to the second latch unit 411_2 in response to the read pulse signal CASP12. The output of the second latch unit 411_2 is outputted to the third latch unit 411_3 in response to the read pulse signal CASP12. The output of the third latch unit 411_3 is outputted to the first latch unit 411_1 in response to the read pulse signal CASP12. Accordingly, the first control signal CTR_B<0:2> is sequentially activated in response to the read pulse signal CASP12 in the order of 'CTR_B<0>'→'CTR_B<1>'→'CTR_B<2>'. In other words, the read pulse signal CASP 12 is counted to generate the first control signal CTR_B<0:2> in the order of 'CTR_B<0>'→'CTR_B<1>'→'CTR_B<2>.' In the same way, the latency signal LTC is counted to generate the second control signal CTR_D<0:2> the order of 'CTR_D<0>'→'CTR_D<1>'→'CTR_D<2>.'

Figure 5:
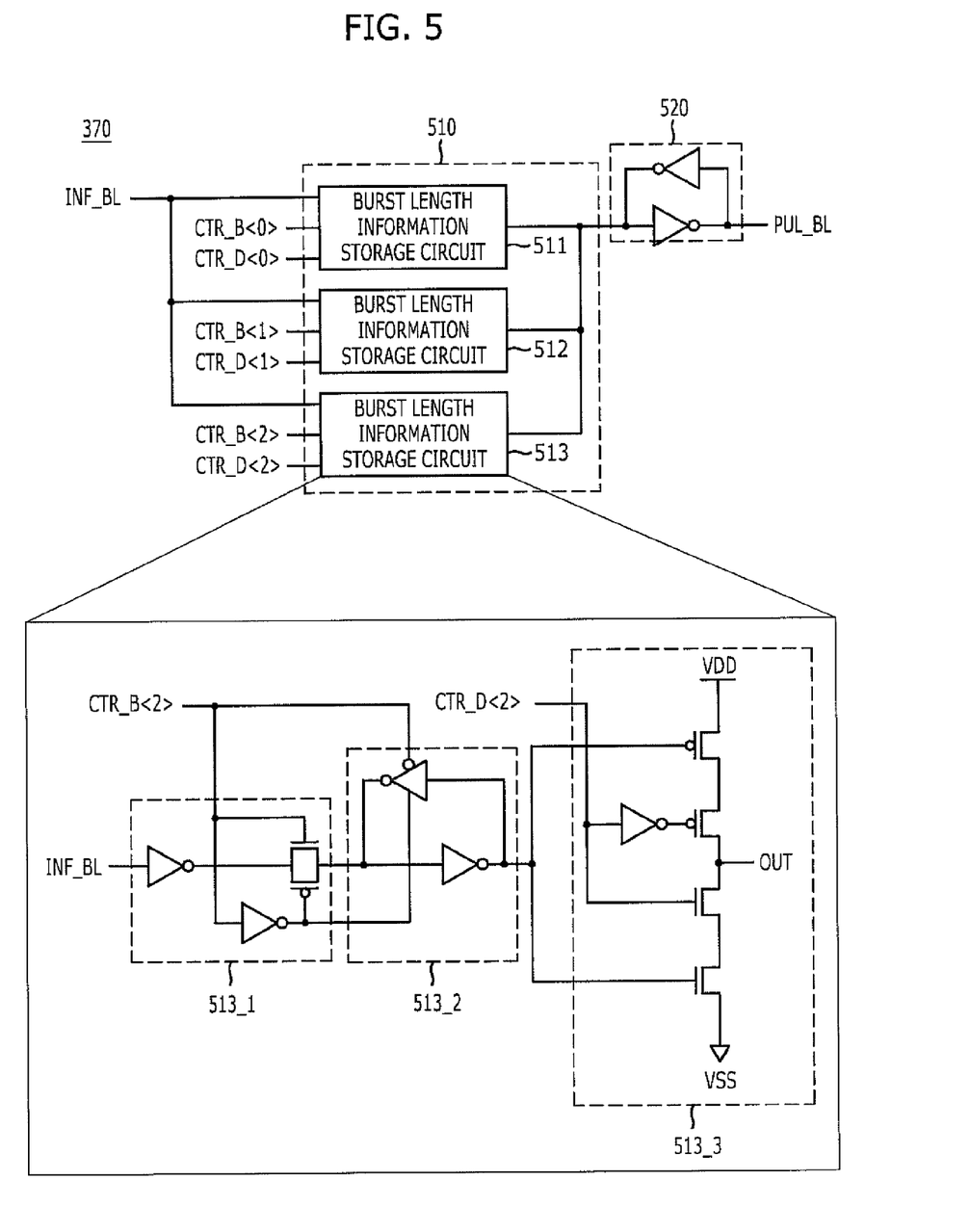
FIG. 5 is a schematic circuit diagram of a burst pulse generation unit shown in FIG. 3.

FIG. 5 is a schematic circuit diagram of the burst pulse generation unit shown in FIG. 3.

The burst pulse generation unit 370 includes a burst length information storage unit 510 and a burst length pulse output unit 520. The burst length information storage unit 510 sequentially stores the burst length information signal INF_BL in response to the first control signal CTR_B<0:2> and sequentially outputs the burst length information signal INF_BL as the burst length pulse signal PUL_BL in response to the second control signal CTR_D<0:2>. The burst length information storage unit 510 includes three burst length information storage circuits 511 to 513, each of which stores the burst length information signal INF_BL in response to a corresponding bit of the first control signal CTR_B<0:2> and outputs the burst length pulse signal PUL_BL in response to a corresponding bit of the second control signal CTR_D<0:2>. For example, the first burst length information storage circuit 511 stores the burst length information signal INF_BL in response to the first bit CTR_B<0> of the first control signal CTR_B<0:2> and outputs the burst length pulse signal PUL_BL in response to the first bit CTR_D<0> of the second control signal CTR_D<0:2>.

The internal structures of the burst length information storage circuits 511 to 513 are the same as one another. Hereinafter, the internal structure of the third burst length information storage circuit 513 is explained as an example.

The third burst length information storage circuit 513 includes an input unit 513_1, a storage unit 513_2, and an output unit 513_3. The input unit 513_1 receives the burst length information signal INF_BL in response to the third bit CTR_B<2> of the first control signal CTR_B<0:2>. The storage unit 513_2 stores an output of the input unit 513_1 in response to the third bit CTR_B<2> of the first control signal CTR_B<0:2>. The output unit 513_3 outputs an output of the storage unit 513_2 in response to the third bit CTR_D<2> of the second control signal CTR_D<0:2>.

Figure 6:
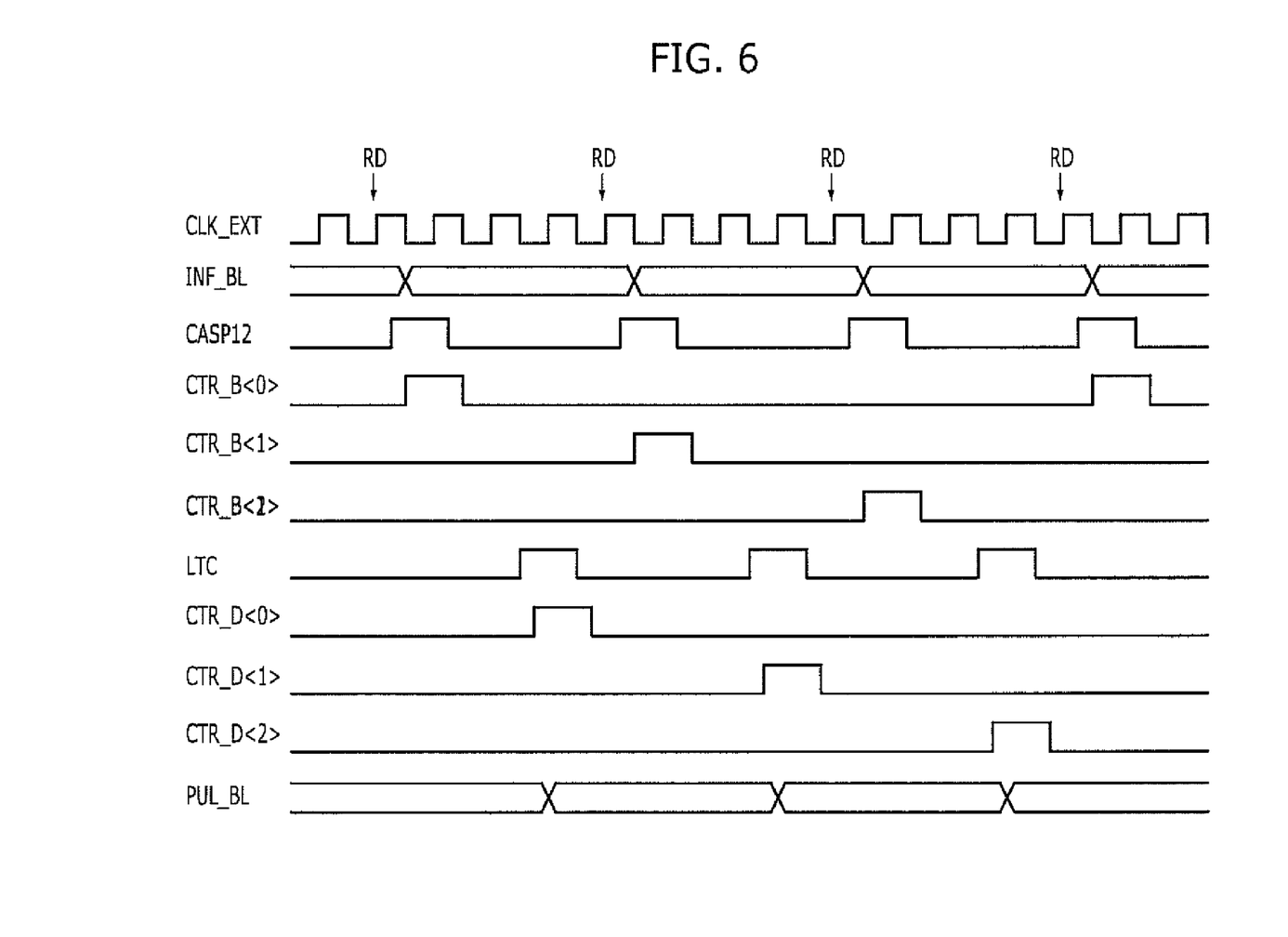
FIG. 6 is a waveform diagram illustrating an operation of the semiconductor memory device shown in FIG. 3.

FIG. 6 is a waveform diagram illustrating an operation of the semiconductor memory device shown in FIG. 3.

As shown in FIG. 3, the burst length information signal INF_BL is externally inputted based on the read command signal RD and the read pulse signal CASP12 is also generated based on the read command signal RD by the read pulse generation unit 310. Thus, the pulse width of the read pulse signal CASP12 is determined by the read pulse generation unit 310. According to an example, the pulse width of the read pulse signal CASP12 is set to be sufficiently long enough to receive the burst length information signal INF_BL. When the read pulse signal CASP12 is activated as a logic high level, the first bit CTR_B<0> of the first control signal CTR_B<0:2> has a logic high level and the other bits CTR_B<1:2> of the first control signal CTR_B<0:2> have a logic low level. Accordingly, the burst length information signal INF_BL is stored in the first storage circuit 511.

The latency generation unit 330 activates the latency signal LTC corresponding to the read command signal RD and the CAS latency signal CL. According to an example, a pulse width of the latency signal LTC is set to be sufficiently long enough to receive the burst length information signal INF_BL. When the latency signal LTC is activated as a logic high level, the first bit CTR_D<0> of the second control signal CTR_D<0:2> has a logic high level and the other bits CTR_D<1:2> of the second control signal CTR_D<0:2> have a logic low level. Accordingly, the data signal stored in the first storage circuit 511 is outputted as the burst length pulse signal PUL_BL.

The present invention in accordance with above embodiment stores the burst length information signal INF_BL and outputs the burst length pulse signal PUL_BL by using a code controlled latching method. That is, the burst length information signal INF_BL is stored in response to the first control signal CTR_B<0:2> and the burst length pulse signal PUL_BL is outputted in response to the second control signal CTR_D<0:2>. Therefore, it is possible to reduce problems caused by variations of power, voltage and temperature (PVT) conditions. In addition, the semiconductor memory device in accordance with the above embodiment of the present invention reliably recognizes the burst length information signal INF_BL for the high frequency operations as well as the low frequency operations.

When the read operations consecutively occur, the burst length information storage circuits 511 to 513 sequentially store the burst length information signal INF_BL in response to the first control signal CTR_B<0:2> which is enabled by the read command signal RD and outputs the burst length information signal INF_BL as the burst length pulse signal PUL_BL in response to the second control signal CTR_D<0:2> which is enabled by the latency signal LTC. Thus, a valid window of the burst length information signal INF_BL stored at each of the burst length information storage circuits 511 to 513 is expanded to a period for which each burst length information signal INF_BL is stored in a corresponding one of the burst length information storage circuits 511 to 513.

In detail, the burst length information signal INF_BL corresponding to the first read command signal RD is stored in the first burst length information storage circuit 511. Thereafter, the burst length information signals INF_BL corresponding to the second and third read commands RD are sequentially and respectively stored in the second and third burst length information storage circuits 512 and 513. Then, a new burst length information signal INF_BL corresponding to the fourth read command signal RD is stored to the first burst length information storage circuit 511. That is, the valid window of the burst length information signal INF_BL stored in the first burst length information storage circuit 511 and corresponding to the first read command signal RD is equal to approximately a period between occurrences of the first and fourth read command signals.

For performing the read operation correctly, the latency signal LTC is required to be activated during the valid window of the burst length information signal INF_BL. By expanding the valid window of the burst length information signal INF_BL, the generation of the burst length pulse signal PUL_BL in response to the burst length information signal INF_BL and the latency signal LTC is performed reliably. Therefore, the semiconductor memory device may perform operations reliably.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a burst pulse generation unit configured to store a burst length information signal in response to a first control signal and output the burst length information signal as a burst pulse signal in response to a second control signal; and
   an input/output(I/O) control unit configured to generate the first and second control signals in response to a read pulse signal and a latency signal, respectively.

2. The semiconductor memory device of claim 1, wherein the burst length information signal is set to have one of different values at each input timing of a read command signal.

3. The semiconductor memory device of claim 1, further comprising a read pulse generation unit configured to generate the read pulse signal having a predetermined pulse width in response to a read command signal.

4. The semiconductor memory device of claim 1, further comprising a latency generation unit configured to count an external clock signal and an internal clock signal and generate the latency signal corresponding to a column access strobe (CAS) latency signal in response to a read command signal.

5. The semiconductor memory device of claim 1, wherein the I/O control unit includes:
- a first control signal generation unit configured to count the read pulse signal and generate the first control signal; and
- a second control signal generation unit configured to count the latency signal and generate the second control signal.

6. The semiconductor memory device of claim 5, wherein the first control signal generation unit includes:
- a shift unit configured to perform a shift operation in response to the read pulse signal; and
- an output unit configured to generate the first control signal in response to the read pulse signal and an output of the shift unit.

7. The semiconductor memory device of claim 6, wherein the shift unit includes a plurality of latch units connected to one another in series, each of which performs a latch operation in response to the read pulse signal.

8. The semiconductor memory device of claim 5, wherein the second control signal generation unit includes:
- a shift unit configured to perform a shift operation in response to the latency signal; and
- an output unit configured to generate the second control signal in response to the latency signal and an output of the shift unit.

9. The semiconductor memory device of claim 8, wherein the shift unit includes a plurality of latch units connected to one another in series, each of which performs a latch operation in response to the latency signal.

10. The semiconductor memory device of claim 1, wherein the first and second control signals are code signals sequentially activated in response to the read pulse signal and the latency signal, respectively.

11. The semiconductor memory device of claim 1, wherein the first control signal is activated prior to the second control signal.

12. The semiconductor memory device of claim 1, wherein the burst pulse generation unit includes:
- a plurality of storage units configured to sequentially store the burst length information signal in response to the first control signal and sequentially output the burst length information signal in response to the second control signal; and
- a pulse output unit configured to output outputs of the storage units as the burst pulse signal.

13. The semiconductor memory device of claim 12, wherein each of the storage units includes:
- an input unit configured to receive the burst length information signal in response to the first control signal;
- a storage circuit configured to store an output of the input unit in response to the first control signal; and
- an output unit configured to output an output of the storage circuit in response to the second control signal.

14. An operation method of a semiconductor memory device, comprising:
- storing a first burst length information signal corresponding to a first read pulse signal in response to the first read pulse signal;
- outputting the first burst length information signal as a burst pulse signal in response to a latency signal corresponding to the first read pulse signal;
- storing a second burst length information signal corresponding to a second read pulse signal in response to the second read pulse signal; and
- outputting the second burst length information signal as the burst pulse signal in response to the latency signal corresponding to the second read pulse signal.

15. The operation method of claim 14, wherein the first and second burst length information signals are set to have different values from each other.

16. The operation method of claim 14, further comprising counting an external clock signal and an internal clock signal and generating the latency signal in response to the first and second read pulse signals.

17. The operation method of claim 14, wherein storing the first and second burst length information signals are sequentially performed in response to a control signal generated by counting the first and second read pulse signals, respectively.

18. The operation method of claim 14, wherein outputting the first and second burst length information signals as the burst pulse signal are sequentially performed in response to a control signal generated by counting the latency signal.

* * * * *